United States Patent
Yang

(10) Patent No.: US 8,018,144 B2
(45) Date of Patent: Sep. 13, 2011

(54) ORGANIC LIGHT EMITTING DIODE AND METHOD OF FABRICATING THE SAME

(75) Inventor: Nam-Choul Yang, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 228 days.

(21) Appl. No.: 12/389,181

(22) Filed: Feb. 19, 2009

(65) Prior Publication Data
US 2009/0212691 A1 Aug. 27, 2009

(30) Foreign Application Priority Data
Feb. 26, 2008 (KR) ........................ 10-2008-0017328

(51) Int. Cl.
*H01J 1/62* (2006.01)
(52) U.S. Cl. ........................................ 313/504; 313/506
(58) Field of Classification Search .................. 313/504, 313/506, 509, 512
See application file for complete search history.

(56) References Cited

U.S. PATENT DOCUMENTS

| | | | |
|---|---|---|---|
| 5,773,929 A | 6/1998 | Shi et al. | |
| 6,392,250 B1 | 5/2002 | Aziz et al. | |
| 6,392,339 B1 | 5/2002 | Aziz et al. | |
| 6,514,649 B1 | 2/2003 | Sakaguchi | |
| 6,562,982 B1 | 5/2003 | Hu et al. | |
| 6,670,053 B2 | 12/2003 | Conley | |
| 6,670,054 B1 | 12/2003 | Hu et al. | |
| 6,730,929 B2 | 5/2004 | Fukuyama et al. | |
| 6,881,502 B2 | 4/2005 | Liao et al. | |
| 6,929,872 B2 | 8/2005 | Mori et al. | |
| 7,514,863 B2 | 4/2009 | Lee et al. | |
| 2002/0086180 A1 | 7/2002 | Seo et al. | |
| 2003/0132703 A1 | 7/2003 | Sakaguchi | |
| 2003/0189401 A1 | 10/2003 | Kido et al. | |
| 2004/0124504 A1 | 7/2004 | Hsu | |
| 2004/0202891 A1 | 10/2004 | Ishibashi et al. | |
| 2004/0214041 A1 | 10/2004 | Lu et al. | |

(Continued)

FOREIGN PATENT DOCUMENTS
CN 1441628 A 9/2003
(Continued)

OTHER PUBLICATIONS

SIPO Office action dated Aug. 8, 2008 for Chinese application 200610072693.0, with English translation noting reference TW 588572 in this IDS.

(Continued)

*Primary Examiner* — Vip Patel
(74) *Attorney, Agent, or Firm* — Christie, Parker & Hale, LLP

(57) ABSTRACT

An organic light emitting diode (OLED) and a method of fabricating the same, in which an intermediate layer is formed between a first hole transport layer (HTL) and a second hole transport layer to facilitate supply of current to an emission layer (EML), thereby increasing the luminance and life span of the OLED. The OLED includes a first electrode, a hole injection layer (HIL) disposed on the first electrode, a first hole transport layer disposed on the hole injection layer, an intermediate layer disposed on the first hole transport layer, a second hole transport layer disposed on the intermediate layer, an emission layer disposed on the second hole transport layer, and a second electrode disposed on the emission layer.

15 Claims, 2 Drawing Sheets

U.S. PATENT DOCUMENTS

| | | | |
|---|---|---|---|
| 2005/0084713 A1 | 4/2005 | Kido et al. | |
| 2005/0196526 A1 | 9/2005 | Ishida | |
| 2005/0280355 A1* | 12/2005 | Lee et al. | 313/503 |
| 2005/0285114 A1 | 12/2005 | Kang et al. | |
| 2006/0099447 A1* | 5/2006 | Lee et al. | 428/690 |
| 2006/0099448 A1 | 5/2006 | Lu et al. | |
| 2006/0105200 A1 | 5/2006 | Poplavskyy et al. | |
| 2006/0251924 A1 | 11/2006 | Lu et al. | |
| 2007/0009762 A1 | 1/2007 | Hamada et al. | |
| 2007/0013297 A1* | 1/2007 | Park | 313/504 |
| 2008/0038583 A1 | 2/2008 | Itai et al. | |

FOREIGN PATENT DOCUMENTS

| | | |
|---|---|---|
| EP | 0 947 123 B1 | 2/2002 |
| EP | 1 339 264 A2 | 8/2003 |
| JP | 5-331458 | 12/1993 |
| JP | 10-284253 | 10/1998 |
| JP | 2000-150152 | 5/2000 |
| JP | 2000-150170 | 5/2000 |
| JP | 2000-196140 | 7/2000 |
| JP | 2001-6878 | 1/2001 |
| JP | 2002-324680 | 11/2002 |
| JP | 2003-168569 | 6/2003 |
| JP | 2003-272870 | 9/2003 |
| JP | 2004-63408 | 2/2004 |
| JP | 2004-327436 | 11/2004 |
| JP | 2005-166641 | 6/2005 |
| JP | 2006-049394 | 2/2006 |
| JP | 2007-12946 | 1/2007 |
| KR | 2003-0070846 | 9/2003 |
| KR | 10-2004-0065667 | 7/2004 |
| KR | 10-2004-0082333 | 9/2004 |
| KR | 10-2005-0046624 | 5/2005 |
| KR | 10-2007-0024036 | 3/2007 |
| TW | 588572 | 5/2004 |
| WO | WO 02/30159 A1 | 4/2002 |
| WO | WO 2004/029176 A1 | 4/2004 |
| WO | WO 2005/64994 A1 | 7/2005 |
| WO | WO 2005/076753 A2 | 8/2005 |

OTHER PUBLICATIONS

U.S. Office action dated Jul. 11, 2008, for related U.S. Appl. No. 11/402,585 (now issued as U.S. Patent 7,514,863).

U.S. Office action dated Mar. 11, 2010, for related U.S. Appl. No. 11/246,308.

Korean Office action dated Apr. 28, 2009, for priority Korean application 10-2008-0017328, noting listed reference in this IDS.

SIPO Office action dated Dec. 11, 2009, with English translation, for corresponding Chinese application 200610169085.1, noting listed references in this IDS, except for European and Japan references.

SIPO Registration Determination Certificate Nov. 4, 2009, with English cover sheet, for Chinese application 200510131507.1, corresponding to related U.S. Appl. No. 11/246,308, noting listed European and Japan references in this IDS.

U.S. Office action dated Dec. 15, 2008, for related U.S. Appl. No. 11/246,308, noting U.S. Patent and Publications previously filed in this application in an IDS dated Feb. 19, 2009.

U.S. Office action dated Jun. 11, 2009, for related U.S. Appl. No. 11/246,308.

U.S. Office action dated Sep. 24, 2009, for related U.S. Appl. No. 11/246,308, noting U.S. Patent 7,514,863 listed in this IDS.

Japanese Office action dated Aug. 12, 2008, for Japanese application 2005-296426, corresponding to related U.S. Appl. No. 11/246,308, noting Japanese references previously filed in this application in an IDS dated Feb. 19, 2009.

Kato, K., et al., *Organic Light-Emitting Diodes with a Nanostructured Fullerene Layer at the Interface between $Alq_3$ and TPD Layers*, Japan Journal of Applied Physics, vol. 42, Part 1, No. 4B, Apr. 2003, pp. 2526-2529.

Japanese Office action dated Aug. 25, 2009, for Japanese application 2006-294797, corresponding to related U.S. Appl. No. 11/599,132, noting Japanese references and International references listed in this IDS.

European Search Report dated Feb. 1, 2006 (On Order).

Keizo Kato, et al., "Organic Light-Emitting Diodes with a Nanostructured Fullerene Layer at the interface between Alq3 and TPD Layers", Japanese Journal of Applied Physics, vol. 42, No. 4b, pp. 2526-2529, Apr. 2003 (On Order).

Jae-Yoo Kim, et al., "Electrical and Optical Studies of Organic Light Emitting Devices Using SWCNTs-polymer Nanocomposites", Optical Materials, Elsevier Science Publishers B.V. Amsterdam, NL, vol. 21, No. 1-3, pp. 147-151 (On Order).

Patrick Fournet, et al., "A Carbon Nanotube Composite as an Electron-Transport Layer in Organic Light-Emitting Diodes", Conference on Lasers and Electro-Optics (CLEO 2001), Technical Digest, Postconference Edition, MD, US, Tmeds in Optics and Photonics (TOPS), WA, US, vol. 56, pp. 34-35, May 2001 (On Order).

Patrick Fournet, et al., "Enhanced Brightness in Organic Light-Emitting Diodes Using a Carbon Nanotube Composite as an Electron-Transport Layer", Journal of Applied Physics, vol. 90, No. 2, pp. 969-975, Jul. 2001 (On Order).

Chinese Office Action mailed Aug. 29, 2008 (On Order).

European Search Report dated Feb. 1, 2006, for European Patent application 05109233.6.

SIPO Office action dated Aug. 29, 2008, for Chinese Patent application 200510131507.1, with English translation.

Kim, J., et al., *Electrical and optical studies of organic light emitting devices using SWCNTs-polymer nanocomposites*, Optical Materials, vol. 21, No. 1-3, (2002) pp. 147-151.

Fournet, P., et al., *A carbon nanotube composite as an electron-transport layer in organic light-emitting diodes*, Conference on Lasers and Electro-Optics (CLEO 2001), Technical Digest, Postconference Edition, MD, US, Tmeds in Optics and Photonics (TOPS), WA, US, vol. 56, pp. 34-35, May 2001.

Fournet, P., et al., *Enhanced brightness in organic light-emitting diodes using a carbon nanotube composite as an electron-transport layer*, Journal of Applied Physics, vol. 90, No. 2, pp. 969-975, Jul. 2001.

* cited by examiner

US 8,018,144 B2

ORGANIC LIGHT EMITTING DIODE AND METHOD OF FABRICATING THE SAME

CROSS-REFERENCE TO RELATED APPLICATION

This application claims priority to and the benefit of Korean Patent Application No. 10-2008-17328, filed Feb. 26, 2008, the entire content of which is incorporated herein by reference.

BACKGROUND OF THE INVENTION

1. Field of the Invention

The present invention relates to an organic light emitting diode (OLED) and a method of fabricating the same and, more particularly, to an OLED in which an intermediate layer is formed between a first hole transport layer (HTL) and a second hole transport layer.

2. Description of the Related Art

An organic light emitting diode (OLED) is an emissive display that is made ultrathin and lightweight and can be fabricated in a simple process using a small number of components. Also, the OLED has high resolution and a wide viewing angle and is capable of displaying a realistic moving image with high color purity. Furthermore, the OLED can be driven at low power and low voltage and is adequate for a mobile display device in terms of its electrical properties.

In a conventional OLED, a pixel electrode is disposed on a substrate with a suitable control device (e.g., a thin film transistor), an organic layer having at least an emission layer (EML) is disposed on the pixel electrode, and an opposing electrode is disposed on the organic layer.

In order to facilitate injection or transport of holes from the pixel electrode to the emission layer, the organic layer may further include a hole injection layer (HIL) or a hole transport layer (HTL) between the pixel electrode and the emission layer.

Currently, a lot of research has been conducted on improving the efficiency and life span of OLEDs. However, the conventional hole injection layer and hole transport layer have a specific technical limit that limits how much the efficiency and life span of the OLEDs can be improved.

SUMMARY OF THE INVENTION

Aspects of embodiments of the present invention are directed toward an organic light emitting diode (OLED) and a method of fabricating the same, which facilitate supply of current to an emission layer to increase the luminance and life span of the OLED.

Another aspect of an embodiment of the present invention is directed toward an OLED having an intermediate layer formed between a first hole transport layer (HTL) and a second hole transport layer to facilitate supply of current to an emission layer (EML), thereby increasing the luminance and life span of the OLED.

According to an embodiment of the present invention, an OLED includes: a first electrode; a hole injection layer (HIL) disposed on the first electrode; a first hole transport layer (HTL) disposed on the hole injection layer; an intermediate layer disposed on the first hole transport layer; a second hole transport layer disposed on the intermediate layer; an emission layer (EML) disposed on the second hole transport layer; and a second electrode disposed on the emission layer.

According to another embodiment of the present invention, a method of fabricating an OLED includes: forming a first electrode; forming a hole injection layer on the first electrode; forming a first hole transport layer on the hole injection layer; forming an intermediate layer on the first hole transport layer; forming a second hole transport layer on the intermediate layer; forming an emission layer on the second hole transport layer; and forming a second electrode on the emission layer.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1A:
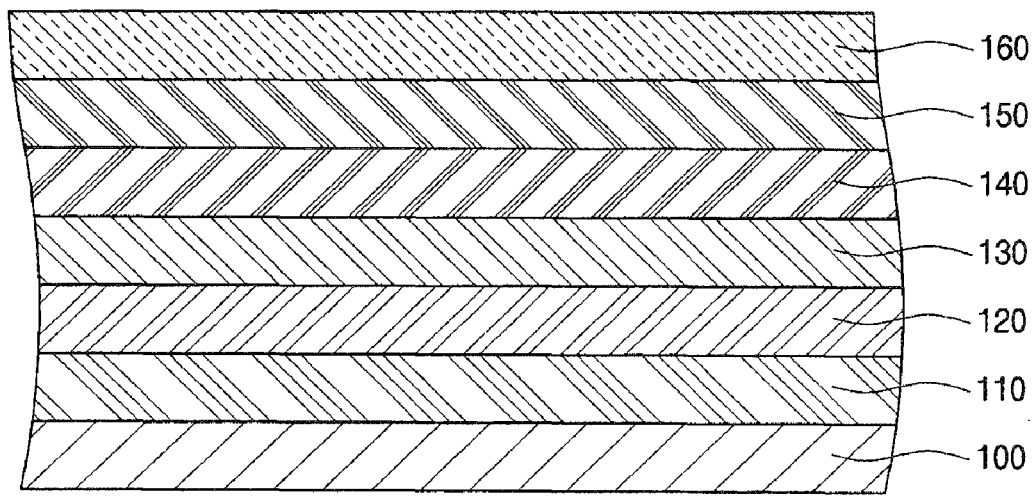
FIGS. 1A and 1B are cross-sectional schematic views of organic light emitting diodes (OLEDs) according to embodiments of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween. Like reference numerals designate like elements throughout the specification.

Figure 1B:
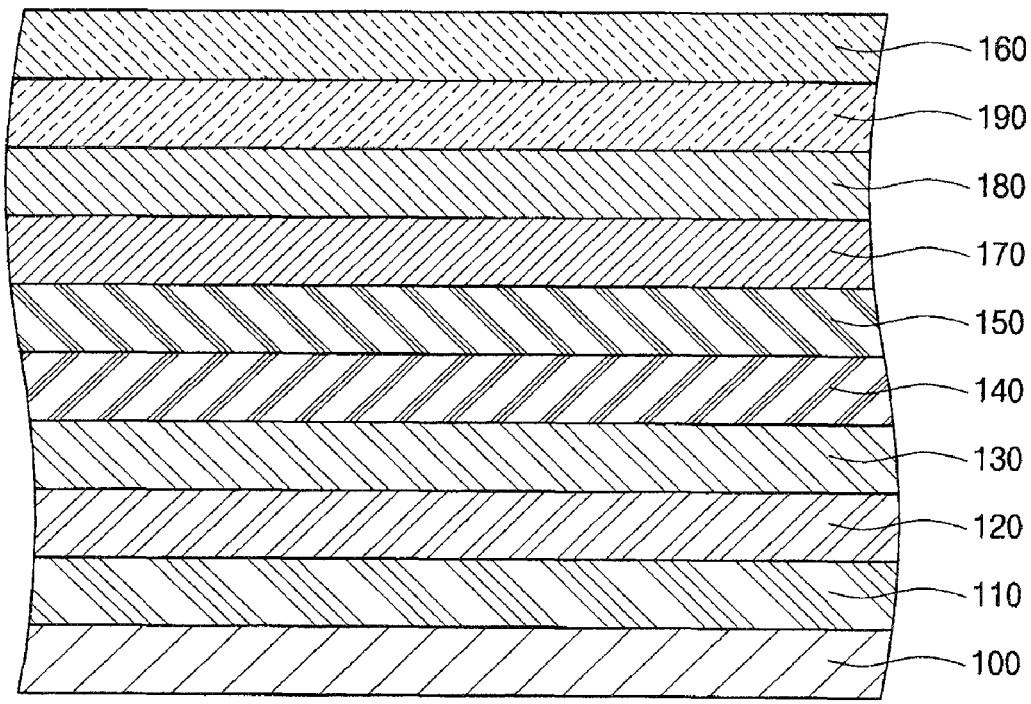

FIGS. 1A and 1B are cross-sectional schematic views of organic light emitting diodes (OLEDs) according to embodiments of the present invention.

Referring to FIG. 1A, a first electrode 100 is formed on a substrate. The substrate may be formed of glass, plastic, and/or steel use stainless (SUS). A thin film transistor (TFT) having a semiconductor layer, a gate electrode, and source and drain electrodes may be further formed on the substrate. The TFT may be electrically connected to the first electrode 100.

The first electrode 100 may be an anode, which may be a transparent electrode or a reflective electrode. When the first electrode 110 is a transparent electrode, it may be formed of indium tin oxide (ITO), indium zinc oxide (IZO), tin oxide (TO), and/or zinc oxide (ZnO). When the first electrode 100 is a reflective electrode, it may be formed by sequentially stacking a reflective layer and a transparent layer. In this case, the reflective layer may be formed of silver (Ag), aluminum (Al), chrome (Cr), molybdenum (Mo), tungsten (W), titanium (Ti), gold (Au), and/or palladium (Pd), and the transparent layer may be formed of ITO, IZO, TO, and/or ZnO. The formation of the first electrode 100 may be performed utilizing a sputtering process, a vapor phase deposition process, an ion beam deposition process, an electron beam (e-beam) deposition process, and/or a laser ablation process.

Thereafter, a hole injection layer (HIL) 110 is formed on the first electrode 100. The hole injection layer 110 may be formed of an arylamine compound, a phthalocyanine compound, and/or a starburst amine. More specifically, the hole injection layer 110 may be formed of 4,4',4"-tris(N-3-methylphenyl-N-phenyl-amino)-triphenylamine(m-MTDATA), 1,3,5-tris[4-(3-methyl-phenyl-phenyl-amino)phenyl]benzene(m-MTDATB), and/or copper phthalocyanine (CuPc). The hole injection layer 110 may be obtained using a thermal vacuum evaporation process, a vapor phase deposition process, a spin-coating process, a dip-coating process, a doctor-blading process, an inkjet printing process, and/or a laser induced thermal imaging (LITI) process. The hole injection layer 110 may be formed to a thickness of about 50 to about 1500 Å.

A first hole transport layer (HTL) 120 is formed on the hole injection layer 110. The first hole transport layer 120 may be formed of an arylene diamine derivative, a starburst compound, a biphenyl diamine derivative having a Spiro group, and/or a ladder compound. More specifically, the first hole transport layer 120 may be formed of N,N'-diphenyl-N,N'-bis(3-methylphenyl)-1,1'-biphenyl-4,4'-diamine (TPD), N,N-di(naphthalene-1-yl)-N,N'-diphenyl-benzidine (α-NPD), and/or 4,4'-bis[N-(1-naphthyl-1-)-N-phenyl-amino]-biphenyl (NPB). The first hole transport layer 120 may be formed to a thickness of about 50 to about 1000 Å. The formation of the first hole transport layer 120 may be performed utilizing a thermal vacuum evaporation process, a vapor phase deposition process, a spin coating process, a dip-coating process, a doctor-blading process, an inkjet printing process, and/or a LITI process.

An intermediate layer 130 is formed on the first hole transport layer 120. In the present embodiment, the intermediate layer 130 is formed between the first hole transport layer 120 and a subsequent second hole transport layer so as to improve the density of current supplied to an emission layer (EML) as compared to that of a comparative example without the intermediate layer 130 under the same (or substantially the same) driving voltage. As a result, the luminance of the OLED may be enhanced, thereby increasing the luminous efficiency and life span of the OLED.

The intermediate layer 130 may be formed of a metal oxide. More specifically, the intermediate layer 130 may be formed of a transition metal oxide. The transition metal oxide may be molybdenum (Mo) oxide, tungsten (W) oxide, and/or vanadium (V) oxide, and, more specifically, the transition metal oxide may be $MoO_3$, $MoO_2$, $WO_3$, and/or $V_2O_5$. The intermediate layer 130 may be obtained utilizing a thermal vacuum evaporation process, a vapor phase deposition process, and/or a LITI process in order to protect the underlying organic layers.

The intermediate layer 130 may be formed to a thickness of about 20 to about 600 Å. When the intermediate layer 130 is formed to a thickness of less than about 20 Å, the enhancement effect of luminous efficiency including current density and luminance may not be very good, for example, at the same applied voltage. Also, when the intermediate layer 130 is formed to a thickness of more than about 600 Å, a higher driving voltage may be required.

Subsequently, a second hole transport layer 140 is formed on the intermediate layer 130. The second hole transport layer 140 may be formed of an arylene diamine derivative, a starburst compound, a biphenyl diamine derivative having a spiro group, and/or a ladder compound. More specifically, the second hole transport layer 140 may be formed of TPD, α-NPD, and/or NPB. The second hole transport layer 140 may be formed of the same material as or a different material from the first hole transport layer 120.

The second hole transport layer 140 may be formed to a thickness of about 50 to about 1000 Å. The second hole transport layer 140 may be obtained utilizing a thermal vacuum evaporation process, a vapor phase deposition process, a spin coating process, a dip-coating process, a doctor-blading process, an inkjet printing process, and/or a LITI process.

Thereafter, an emission layer 150 is formed on the second hole transport layer 140. The emission layer 150 may be formed of any suitable materials with suitable host and dopant materials.

A host material forming the emission layer 150 may be distyrylarylene (DSA) and derivatives thereof, distyrylbenzene (DSB) and derivatives thereof, BAlq, 8-trishydroxyquinoline aluminum (Alq3), 4,4-N,N dicarbazole-biphenyl (CBP), BCP, and/or DCB.

A dopant material forming the emission layer 150 may be a fluorescent dopant and/or a phosphorescent dopant. The florescent dopant may be 4,4'-bis(2,2'-diphenyl vinyl)-1,1'-biphenyl (DPVBi), distyrylamine derivatives, pyrene derivatives, perylene derivatives, distyrylbiphenyl (DSBP) derivatives, 10-(2-benzothiazolyl)-1,1,7,7-tetramethyl-2,3,6,7-tetrahydro-1H,5H,11H-(1) benzopyrano (6,7-8-1,j) quinolizin-11-one (C545T), quinacridone derivatives, 4-(dicyanomethylene)-2-t-butyl-6-(1,1,7,7-tetramethylju-lolidyl-9-enyl)-4 H-pyran(DCJTB), and/or 4-(dicyanomethylene)-2-methyl-6-(4-dimethylaminostyril)-4H-pyrane (DCM).

The phosphorescent dopant may be iridium(m)bis[4,6-di-fluorophenyl)-pyridinato-N,C2']picolinate ($F_2Irpic$), $(F_2ppy)_2Ir(tmd)$, tris(2-phenylpyridine) iridium (III) $(Ir(PPy)_3)$, PQIr, $Btp_2Ir(acac)$, 2,3,7,8,12,13,17,18-octaethyl-21H,23H-porphine platinum (II) (PtOEP), and/or $Ir(piq)_2(acac)$.

The emission layer 150 may be obtained utilizing a thermal vacuum evaporation process, a vapor phase deposition process, a spin coating process, a dip-coating process, a doctor-blading process, an inkjet printing process, and/or a LITI process.

Thereafter, a second electrode 160 is formed on the emission layer 150. The second electrode 160 may be a cathode, which may be a transmissive electrode or a reflective electrode. When the second electrode 160 is a transmissive electrode, it may be formed of a conductive metal having a small work function, and, more specifically, the second electrode 160 may be formed of a material selected from the group consisting of Mg, Ca, Al, Ag, and alloys thereof. In this case, the second electrode 160 may be formed to a thickness that is thin enough to transmit light. When the second electrode 160 is a reflective electrode, it may be formed to a thickness that is thick enough to reflect light. The formation of the second electrode 160 may be performed utilizing a sputtering process, a vapor phase deposition process, an ion beam deposition process, an e-beam deposition process, and/or a laser ablation process.

Referring to FIG. 1B, an OLED according to another embodiment of the present invention may further include at least one of a hole blocking layer (HBL) 170, an electron transport layer (ETL) 180, or an electron injection layer (EIL) 190 between an emission layer 150 and a second electrode 160 in order to facilitate injection and transport of electrons and/or holes between the second electrode 160 and the emission layer 150.

The hole blocking layer 170 may be formed of 2-(4-biphenyl)-5-(4-butylphenyl)-1,3,4-oxadiazole (PBD), spiro-PBD, and/or 3-(4-biphenyl)-4-phenyl-5-(4-tert-butylphenyl)-1,2,4-triazole (TAZ). The hole blocking layer 170 may be formed to a thickness of about 30 to about 500 Å. The electron transport layer 180 may be formed of TAZ, PBD, spiro-PBD, Alq3, BAlq, and/or SAlq. The electron transport layer 180 may be formed to a thickness of about 50 to about 600 Å. Also, the electron injection layer 190 may be formed of LiF, a gallium (Ga) complex, Liq, and/or CsF. The electron injection layer 190 may be formed to a thickness of about 1 to about 100 Å.

Each of the hole blocking layer 170, the electron transport layer 180, and the electron injection layer 190 may be obtained utilizing a thermal vacuum evaporation process, a vapor phase deposition process, a spin-coating process, a dip-coating process, a doctor-blading process, an inkjet printing process, and/or a LITI process.

Unlike the above embodiments, the first electrode 100 may be embodied as a cathode, and the second electrode 160 may be embodied as an anode. In this case, the OLED may include the first electrode 100, the emission layer 150, the second hole transport layer 140, the intermediate layer 130, the first hole transport layer 120, the hole injection layer 110, and the second electrode 160 stacked in sequence.

In an embodiment of the present invention, the intermediate layer 130 is formed between the first and second hole transport layers 120 and 140 so as to improve the density of current supplied to the emission layer 150 as compared to that of a comparative example without the intermediate layer 130 under the same (or substantially the same) driving voltage. As a result, the luminance of the OLED can be enhanced, thereby increasing the luminous efficiency and life span of the OLED.

Hereinafter, an Experimental Example according to an embodiment of the present invention is provided to facilitate understanding of the invention. This invention may, however, be embodied in different forms and should not be construed as limited to the Experimental Example set forth herein.

EXPERIMENTAL EXAMPLE

A first electrode was formed of ITO to a thickness of about 1000 Å. Thereafter, a hole injection layer was formed of mTDATA on the first electrode to a thickness of about 600 Å, and a first hole transport layer was formed of NPB on the hole injection layer to a thickness of about 150 Å. An intermediate layer was formed of $MoO_3$ on the first hole transport layer to a thickness of about 50 Å. A second hole transport layer was formed of NPB on the intermediate layer to a thickness of about 100 Å. A red phosphorescent emission layer was formed on the second hole transport layer utilizing a mixture of CBP, as a host, and 12% by weight of $Ir(piq)_3$, as a dopant, to a thickness of about 300 Å. An electron transport layer was formed of Alq3 on the red phosphorescent emission layer to a thickness of about 350 Å. Subsequently, an electron injection layer was formed of LiF on the electron transport layer to a thickness of about 5 Å. A second electrode was formed of Al on the electron injection layer to a thickness of about 1500 Å.

COMPARATIVE EXAMPLE

A first electrode was formed of ITO to a thickness of about 1000 Å. Thereafter, a hole injection layer was formed of mTDATA on the first electrode to a thickness of about 600 Å, and a hole transport layer was formed of NPB on the hole injection layer to a thickness of about 250 Å. A red phosphorescent emission layer was formed on the hole transport layer utilizing a mixture of CBP, as a host, and 12% by weight of $Ir(piq)_3$, as a dopant, to a thickness of about 300 Å. An electron transport layer was formed of Alq3 on the red phosphorescent emission layer to a thickness of about 350 Å. Subsequently, an electron injection layer was formed of LiF on the electron transport layer to a thickness of about 5 Å. A second electrode was formed of Al on the electron injection layer to a thickness of about 1500 Å.

Figure 2A:
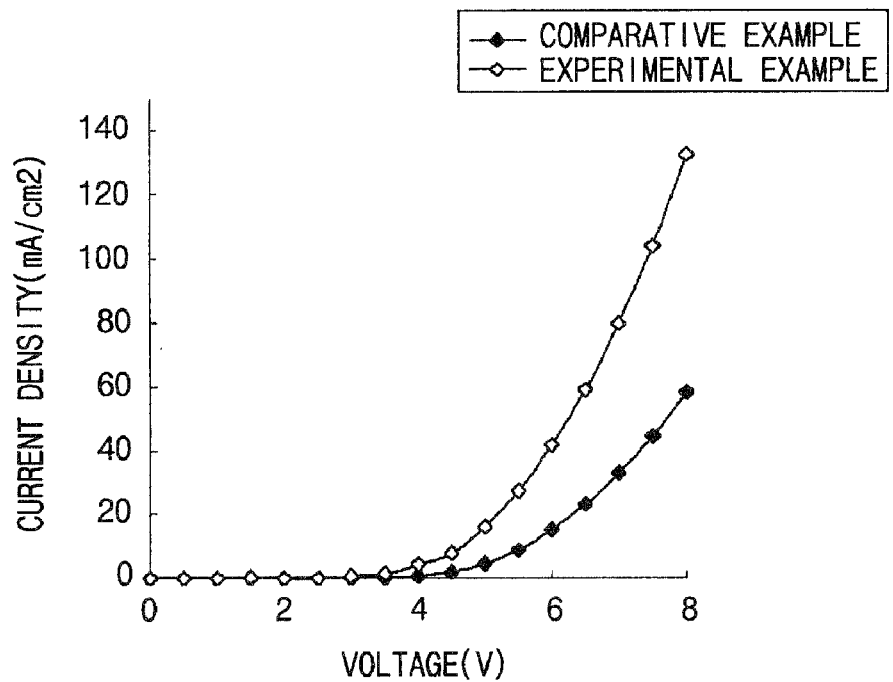
FIG. 2A is a graph of current density versus voltage in OLEDs fabricated according to an Experimental Example and a Comparative Example.
Figure 2B:
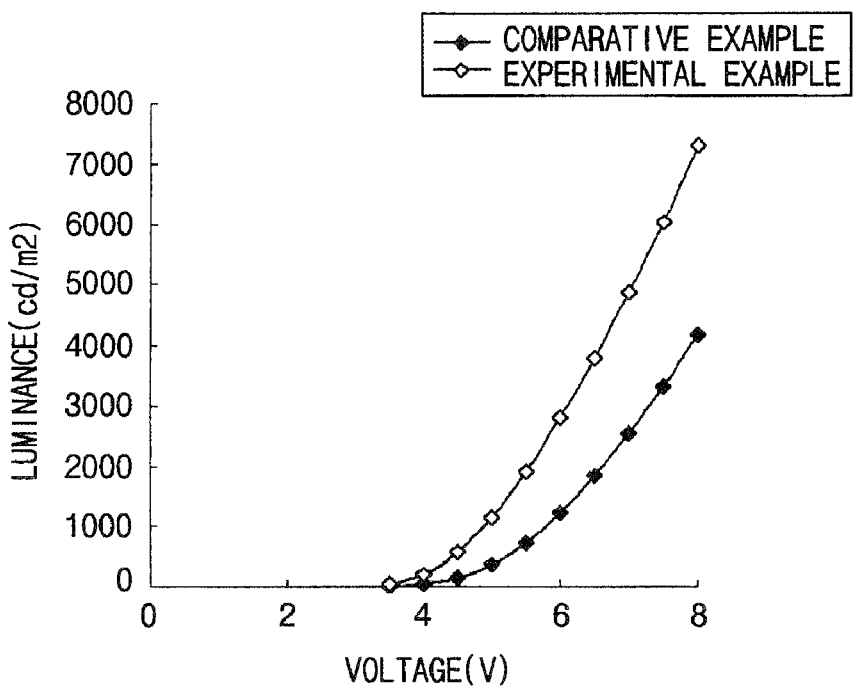
FIG. 2B is a graph of luminance versus voltage in the OLEDs fabricated according to the Experimental Example and the Comparative Example.

FIG. 2A is a graph of current density versus voltage in OLEDs fabricated according to the Experimental Example and the Comparative Example, and FIG. 2B is a graph of luminance versus voltage in the OLEDs fabricated according to the Experimental Example and the Comparative Example. In FIG. 2A, an abscissa (x-coordinate) denotes a voltage (V), and an ordinate (y-coordinate) denotes a current density (mA/$cm^2$). In FIG. 2B, an abscissa denotes a voltage (V), and an ordinate denotes luminance ($cd/m^2$).

Referring to FIG. 2A, even when the same voltage was applied to both the OLEDs, the density of current supplied to the emission layer of the OLED according to the Experimental Example was markedly increased as compared to that of the OLED according to the Comparative Example. Referring to FIG. 2B, it can be observed that the luminance of the OLED according to the Experimental Example was much higher than that of the OLED according to the Comparative Example at the same applied voltage.

Therefore, when the intermediate layer is formed between the first and second hole transport layers as according to an embodiment of the present invention, the density of current supplied to the emission layer can be improved as compared to that of a comparative example without the intermediate layer under the same (or substantially the same) driving voltage. As a result, the luminance of the OLED can be enhanced, thereby increasing the luminous efficiency and life span of the OLED.

According to an embodiment of the present invention, an intermediate layer is formed between a first hole transport layer and a second hole transport layer to facilitate supply of current to an emission layer, thereby increasing the luminance and life span of an OLED.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting diode (OLED) comprising:
   a first electrode;
   a hole injection layer on the first electrode;
   a first hole transport layer on the hole injection layer;
   an intermediate layer directly on the first hole transport layer;
   a second hole transport layer on the intermediate layer;
   an emission layer on the second hole transport layer; and
   a second electrode on the emission layer.

2. The OLED according to claim 1, wherein the intermediate layer comprises a metal oxide.

3. The OLED according to claim 2, wherein the metal oxide is a transition metal oxide.

4. The OLED according to claim 3, wherein the transition metal oxide comprises an oxide selected from the group consisting of molybdenum (Mo) oxide, tungsten (W) oxide, and vanadium (V) oxide.

5. The OLED according to claim 3, wherein the transition metal oxide comprises an oxide selected from the group consisting of $MoO_3$, $MoO_2$, $WO_3$, and $V_2O_5$.

6. The OLED according to claim 1, wherein the first and second hole transport layers are composed of identical material.

7. The OLED according to claim 1, wherein the first and second hole transport layers are composed of different materials.

8. An organic light emitting diode (OLED) comprising:
a first electrode;
a first hole transport layer;
a hole injection layer between the first electrode and the first hole transport layer;
a second hole transport layer directly on an intermediate layer, the intermediate layer between the first hole transport layer and the second hole transport layer;
a second electrode; and
an emission layer between the second hole transport layer and the second electrode.

9. The OLED according to claim 8, wherein the intermediate layer comprises a metal oxide.

10. The OLED according to claim 9, wherein the metal oxide is a transition metal oxide.

11. The OLED according to claim 10, wherein the transition metal oxide comprises an oxide selected from the group consisting of molybdenum (Mo) oxide, tungsten (W) oxide, and vanadium (V) oxide.

12. The OLED according to claim 10, wherein the transition metal oxide comprises an oxide selected from the group consisting of $MoO_3$, $MoO_2$, $WO_3$, and $V_2O_5$.

13. The OLED according to claim 8, wherein the first and second hole transport layers are composed of identical material.

14. The OLED according to claim 8, wherein the first and second hole transport layers are composed of different materials.

15. The OLED according to claim 1, wherein the second hole transport layer is directly on the intermediate layer.

* * * * *